US010629466B2

(12) United States Patent
Ito et al.

(10) Patent No.: US 10,629,466 B2
(45) Date of Patent: Apr. 21, 2020

(54) ELECTROSTATIC CHUCK DEVICE INCLUDING A HEATING MEMBER

(71) Applicant: SUMITOMO OSAKA CEMENT CO., LTD., Tokyo (JP)

(72) Inventors: Tomomi Ito, Tokyo (JP); Yukio Miura, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 300 days.

(21) Appl. No.: 15/558,039

(22) PCT Filed: Feb. 18, 2016

(86) PCT No.: PCT/JP2016/054765
§ 371 (c)(1),
(2) Date: Sep. 13, 2017

(87) PCT Pub. No.: WO2016/152345
PCT Pub. Date: Sep. 29, 2016

(65) Prior Publication Data
US 2018/0068883 A1  Mar. 8, 2018

(30) Foreign Application Priority Data
Mar. 24, 2015 (JP) .................... 2015-061295

(51) Int. Cl.
*H01L 21/683* (2006.01)
*B32B 7/12* (2006.01)
(Continued)

(52) U.S. Cl.
CPC ............ *H01L 21/6831* (2013.01); *B32B 3/10* (2013.01); *B32B 3/30* (2013.01); *B32B 5/16* (2013.01);
(Continued)

(58) Field of Classification Search
CPC ............. B32B 7/12; C08K 2003/2227; C09D 183/04; C09J 183/04; H01L 21/67103;
(Continued)

(56) References Cited

U.S. PATENT DOCUMENTS 5,834,101 A * 11/1998 Hayashi ............... H01L 23/142
428/209
9,343,346 B2 * 5/2016 Kosakai ............ H01L 21/67103
(Continued)

FOREIGN PATENT DOCUMENTS

JP  2011061049 A *  3/2011
JP  2011061049 A    3/2011
(Continued)

OTHER PUBLICATIONS

International Search Report from Application No. PCT/JP2016/054765, dated Apr. 19, 2106.

*Primary Examiner* — Thienvu V Tran
*Assistant Examiner* — Nicolas Bellido
(74) *Attorney, Agent, or Firm* — Greenblum & Bernstein, P.L.C.

(57) ABSTRACT

Provided is an electrostatic chuck device which includes: an electrostatic chuck section having one main surface serving as a placing surface on which a plate-shaped sample is placed, and having a built-in internal electrode for electrostatic attraction; a first adhesion layer which contains spacers and a silicone adhesive and in which a layer thickness D is in a range of 3 to 25 μm and a ratio ($\phi_S$/D) between the layer thickness D and an average particle diameter $\phi_S$ of the spacers is in a range of 0.1 to 1.0; a plurality of heating members bonded to the surface on the side opposite to the placing surface of the electrostatic chuck section in a pattern having a gap with respect to one another by the first adhesion layer; a second adhesion layer which contains a silicone
(Continued)

adhesive; and a base section having a function of cooling the electrostatic chuck section.

6 Claims, 1 Drawing Sheet (51) Int. Cl.
| | |
|---|---|
| C09J 183/04 | (2006.01) |
| H01L 21/67 | (2006.01) |
| H01L 21/687 | (2006.01) |
| H02N 13/00 | (2006.01) |
| B32B 25/20 | (2006.01) |
| B32B 9/04 | (2006.01) |
| B32B 9/00 | (2006.01) |
| B32B 15/18 | (2006.01) |
| B32B 15/16 | (2006.01) |
| B32B 5/30 | (2006.01) |
| B32B 15/06 | (2006.01) |
| B32B 3/10 | (2006.01) |
| B32B 15/20 | (2006.01) |
| B32B 5/16 | (2006.01) |
| B32B 7/04 | (2019.01) |
| B32B 3/30 | (2006.01) |
| B32B 15/04 | (2006.01) |
| C08K 3/22 | (2006.01) |
| C09D 183/04 | (2006.01) |

(52) U.S. Cl.
CPC ............ *B32B 5/30* (2013.01); *B32B 7/04* (2013.01); *B32B 7/12* (2013.01); *B32B 9/005* (2013.01); *B32B 9/041* (2013.01); *B32B 9/043* (2013.01); *B32B 15/043* (2013.01); *B32B 15/06* (2013.01); *B32B 15/16* (2013.01); *B32B 15/18* (2013.01); *B32B 15/20* (2013.01); *B32B 25/20* (2013.01); *C09J 183/04* (2013.01); *H01L 21/67103* (2013.01); *H01L 21/67109* (2013.01); *H01L 21/68757* (2013.01); *H02N 13/00* (2013.01); *B32B 2255/20* (2013.01); *B32B 2255/205* (2013.01); *B32B 2264/102* (2013.01); *B32B 2264/107* (2013.01); *B32B 2270/00* (2013.01); *B32B 2307/202* (2013.01); *B32B 2307/302* (2013.01); *B32B 2307/306* (2013.01); *B32B 2307/536* (2013.01); *B32B 2307/732* (2013.01); *B32B 2457/00* (2013.01); *C08K 2003/2227* (2013.01); *C09D 183/04* (2013.01)

(58) Field of Classification Search
CPC ............ H01L 21/67109; H01L 21/683; H01L 21/6831; H01L 21/6833; H01L 21/68757; H02N 13/00; Y10T 156/10; Y10T 428/2848
See application file for complete search history.

(56) References Cited

U.S. PATENT DOCUMENTS

| | | | |
|---|---|---|---|
| 2003/0178638 A1* | 9/2003 | Fujii | H01L 21/68757 257/192 |
| 2005/0085578 A1* | 4/2005 | Iguchi | H03H 9/0585 524/403 |
| 2010/0015605 A1 | 1/2010 | Zucman-Rossi et al. | |
| 2010/0156054 A1* | 6/2010 | Sun | C09D 183/04 279/128 |
| 2011/0229837 A1* | 9/2011 | Migita | C23C 14/50 432/227 |
| 2013/0093145 A1* | 4/2013 | Hori | H01L 21/6833 279/128 |

FOREIGN PATENT DOCUMENTS

| | | | |
|---|---|---|---|
| JP | 2012512953 A | | 6/2012 |
| JP | 5267603 B2 | | 8/2013 |
| JP | 2013258268 A | * | 12/2013 |
| JP | 2013258268 A | | 12/2013 |
| JP | 5557164 A | | 7/2014 |

* cited by examiner

ELECTROSTATIC CHUCK DEVICE INCLUDING A HEATING MEMBER

TECHNICAL FIELD

The present invention relates to an electrostatic chuck device.

BACKGROUND ART

In a process of manufacturing an electrostatic chuck device, in general, an electrostatic chuck section, a heating member, and a base section are bonded together with an adhesive or the like to form a laminated body, and subsequently, the laminated body is subjected to hot calender work. Due to the hot calender work, there is a case where a problem occurs in the electrostatic chuck device, and various studies have been made in order to solve such a problem.

For example, in order to provide an electrostatic chuck capable of rapidly heating and cooling a substrate to be processed while suppressing the occurrence of cracks in a ceramic plate, an electrostatic chuck is disclosed which includes: a ceramic plate which has a recess portion provided in a main surface thereof and an electrode provided in the interior thereof; a temperature-controlling plate joined to the main surface of the ceramic plate; a heater bonded to the ceramic plate in the recess portion provided in the ceramic plate by a second joining agent; and a first joining agent provided between the ceramic plate with the heater bonded thereto with the second joining agent and the temperature-controlling plate, in which the first joining agent has a first base compound which includes an organic material, first amorphous fillers which include an inorganic material, and first spherical fillers which includes an inorganic material, the first amorphous fillers and the first spherical fillers are dispersed and mixed in the first base compound, the first base compound, the first amorphous filler, and the first spherical filler are made of an electrically insulating material, the average diameter of the first spherical fillers is larger than the maximum value of the short diameters of all the first amorphous fillers, the thickness of the first joining agent is the same as or larger than the average diameter of the first spherical fillers, the width of the recess portion is wider than the width of the heater, the depth of the recess portion is deeper than the thickness of the heater, a first distance between the main surface on the temperature-controlling plate side of the heater and a main surface of the temperature-controlling plate is longer than a second distance between the main surface between the recess portions of the ceramic plate and the main surface of the temperature-controlling plate (refer to, for example, Patent Literature No. 1).

Further, in order to provide an electrostatic chuck which has a thin joining agent and high thermal conductivity and in which cracks hardly occur in constituent parts of the electrostatic chuck, an electrostatic chuck is disclosed which includes: a ceramic dielectric which has an electrode formed on the surface thereof; a ceramic substrate which supports the ceramic dielectric; and a first joining agent which joins the ceramic dielectric and the ceramic substrate together, in which the first joining agent has a first base compound which includes an organic material, first amorphous fillers which include an inorganic material, and first spherical fillers which include an inorganic material, the first amorphous fillers and the first spherical fillers are dispersed and mixed in the first base compound, the first base compound, the first amorphous filler, and the first spherical filler are made of an electrically insulating material, the average diameter of the first spherical fillers is larger than the maximum value of the short diameters of all the first amorphous fillers, the thickness of the first joining agent is the same as or larger than the average diameter of the first spherical fillers (refer to, for example, Patent Literature No. 2).

CITATION LIST

Patent Literature

[Patent Literature No. 1] Japanese Patent No. 5267603
[Patent Literature No. 2] Japanese Patent No. 5557164

SUMMARY OF INVENTION

Technical Problem

According to the methods described in Patent Literature No. 1 and Patent Literature No. 2, although it is possible to prevent the protrusion of the adhesive due to a hot calender, a sufficient adhesion property between an electrostatic chuck section and a base section cannot be secured for the following reasons.

A silicone adhesive is generally used for the adhesion between the electrostatic chuck section and a heating member, and the hardened surface of the silicone adhesive often has a water-repellent property and an oil-repellent property. For this reason, the interface between the adhesive which bonds the electrostatic chuck section and the heating member to the base section and the silicone adhesive has a poor adhesion property, and as a result, there is a case where the adhesive force between the electrostatic chuck section and the base section decreases.

The present invention has an object to provide an electrostatic chuck device in which it is possible to secure the layer thickness of a first adhesion layer which bonds a heating member to an electrostatic chuck section and suppress a decrease in adhesive force and the adhesive force between the first adhesion layer and a second adhesion layer adjacent to the first adhesion layer is excellent, and a task thereof is to achieve the object.

Solution to Problem

Specific means for achieving the above task is as follows.
<1> An electrostatic chuck device including: an electrostatic chuck section having one main surface serving as a placing surface on which a plate-shaped sample is placed, and having a built-in internal electrode for electrostatic attraction; a first adhesion layer which contains spacers and a silicone adhesive and in which a layer thickness D is in a range of 3 to 25 μm and a ratio ($\phi_S/D$) between the layer thickness D and an average particle diameter $\phi_S$ of the spacers is in a range of 0.1 to 1.0; a plurality of heating members bonded to the surface on the side opposite to the placing surface of the electrostatic chuck section in a pattern having a gap with respect to one another by the first adhesion layer; a second adhesion layer which contains a silicone adhesive; and a base section having a function of cooling the electrostatic chuck section, in this order.
<2> The electrostatic chuck device according to the above <1>, wherein a content rate of the spacers having a particle diameter more than twice an average particle diameter in which a cumulative volume percentage in a particle size distribution of the spacers is 50% is 0.1% by mass or less.

<3> The electrostatic chuck device according to the above <1> or <2>, wherein the spacer density in the first adhesion layer is in a range of 0.00003 to 32% by mass.

<4> The electrostatic chuck device according to any one of the above <1> to <3>, wherein the first adhesion layer further includes fillers, and a ratio ($\phi_F/D$) between the layer thickness D of the first adhesion layer and an average particle diameter $\phi_F$ of the fillers is 0.01 or more and less than 0.1.

<5> The electrostatic chuck device according to any one of the above <1> to <4>, wherein the spacer is a metal oxide.

<6> The electrostatic chuck device according to the above <4> or <5>, wherein the filler is a metal oxide.

<7> The electrostatic chuck device according to any one of the above <1> to <6>, wherein the electrostatic chuck section is configured to include a placing plate having one main surface serving as a placing surface on which a plate-shaped sample is placed, and a supporting plate which is integrated with the placing plate and supports the placing plate, and each of the placing plate and the supporting plate is made of an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

Advantageous Effects of Invention

According to the present invention, an electrostatic chuck device is provided in which it is possible to secure the layer thickness of a first adhesion layer which bonds a heating member to an electrostatic chuck section and suppress a decrease in adhesive force and the adhesive force between the first adhesion layer and a second adhesion layer adjacent to the first adhesion layer is excellent.

DESCRIPTION OF EMBODIMENTS

<Electrostatic Chuck Device>

An electrostatic chuck device according to the present invention includes: an electrostatic chuck section having one main surface serving as a placing surface on which a plate-shaped sample is placed, and having a built-in internal electrode for electrostatic attraction; a first adhesion layer which contains spacers and a silicone adhesive and in which a layer thickness D is in a range of 3 to 25 μm and a ratio ($\phi_S/D$) between the layer thickness D and an average particle diameter $\phi_S$ of the spacers is in a range of 0.1 to 1.0; a plurality of heating members bonded to the surface on the side opposite to the placing surface of the electrostatic chuck section in a pattern having a gap with respect to one another by the first adhesion layer; a second adhesion layer which contains a silicone adhesive; and a base section having a function of cooling the electrostatic chuck section, in this order.

First, the laminated configuration of the electrostatic chuck section, the heating member, the first and second adhesion layers, and the base section in the electrostatic chuck device according to the present invention will be described.

Figure 1:
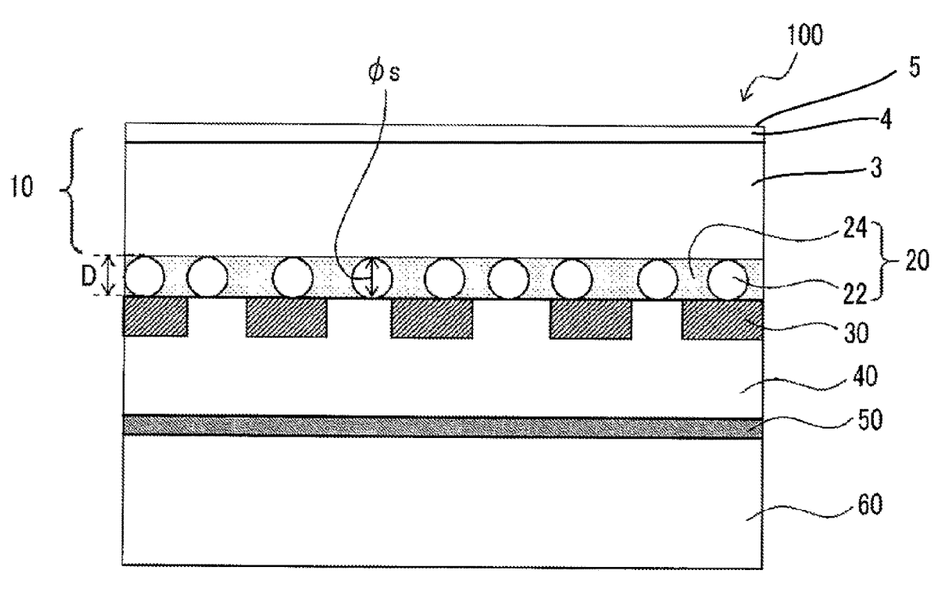
FIG. 1 is a sectional schematic diagram showing an example of a laminated configuration of an electrostatic chuck device according to the present invention.

FIG. 1 is a sectional schematic diagram showing an example of a laminated configuration of the electrostatic chuck device according to the present invention.

An electrostatic chuck device 100 has an electrostatic chuck section 10 for fixing a wafer, the electrostatic chuck section 10 having a placing surface 5 adapted to receive a plate-shaped sample, a heating member 30 which heats the electrostatic chuck section 10, and a thick disk-shaped base section 60 having a function of cooling the electrostatic chuck section 10. A first adhesion layer 20, the heating member 30, a second adhesion layer 40, and an insulating material layer 50 in order from the electrostatic chuck section 10 side are provided between the electrostatic chuck section 10 and the base section 60.

The first adhesion layer 20 contains spacers 22 and a silicone adhesive 24 and may further include, for example, fillers.

The spacers 22 are contained in the first adhesion layer 20, whereby, even if the electrostatic chuck device 100 is pressed by a hot calender in the manufacturing process of the electrostatic chuck device 100, it is difficult for the silicone adhesive 24 to protrude from the first adhesion layer 20 and the silicone adhesive 24 can be retained in the first adhesion layer 20. Further, the ratio ($\phi_S/D$) of the average particle diameter $\phi_S$ of the spacers 22 to the layer thickness D in the first adhesion layer 20 is in a range of 0.1 to 1.0, and therefore, the silicone adhesive 24 can be sufficiently included in the first adhesion layer 20, and thus a decrease in the adhesive force of the first adhesion layer 20 can be suppressed.

The heating members 30 are located on the surface (referred to as a heating member installation surface) on the side opposite to the placing surface of the electrostatic chuck section 10 and fixed to the electrostatic chuck section 10 in a pattern having a gap with respect to one another by the first adhesion layer 20.

The heating member 30 can be configured by, for example, a plurality of patterns formed by meandering a strip-shaped metal material having a narrow width. In FIG. 1, five heating members 30 are shown. However, the heating member 30 may be continuous in a single pattern or may be configured of a plurality of patterns of the same type or different types. For example, a plurality of annular heating members having different diameters may be disposed concentrically.

One of the surfaces of the second adhesion layer 40 is adjacent to the side surfaces and the surface of the heating member 30 and the first adhesion layer 20. The other of the surfaces of the second adhesion layer 40 may be adjacent to the base section 60 or may be adjacent to any other layer. The electrostatic chuck device 100 shown in FIG. 1 has the insulating material layer 50 between the second adhesion layer 40 and the base section 60.

An adhesive for fixing the insulating material layer 50 may be further interposed between the insulating material layer 50 and the base section 60.

The type of any other layer is not limited to a sheet material and may be, for example, a joining layer which enhances the adhesion property between the layers of the heating member 30 and the second adhesion layer 40.

In FIG. 1, the insulating material layer 50 is present at a position adjacent to the base section 60. However, the position of the insulating material layer 50 is not particularly limited and may be provided, for example, between the heating member 30 and the electrostatic chuck section 10, between the heating member 30 and the second adhesion layer 40 and a sheet material, or the like.

Although details of a method of manufacturing the electrostatic chuck device 100 will be described later, the first adhesion layer 20, the heating member 30, and the second adhesion layer 40 can be formed as follows, for example.

A solution (a solution for the first adhesion layer) which includes the spacers 22 and has the silicone adhesive 24 dissolved therein by an arbitrary solvent is prepared, and the solution is applied to the heating member installation surface of the electrostatic chuck section 10 by coating or the like. Subsequently, if, for example, Ti foil (the heating member 30) is attached to the surface to which the solution for the first adhesion layer is applied, the silicone adhesive 24 is cured, and thereafter, the Ti foil is etched into an arbitrary shape, the first adhesion layer 20 is exposed at a place where the Ti foil has been shaved off. Since the spacers 22 are included in the first adhesion layer 20, the surfaces of the spacers 22 are also easily exposed.

The cured silicone adhesive has a liquid-repellent property (a water-repellent property and/or an oil-repellent property), and therefore, in general, even if an adhesive is further applied, it is difficult for the adhesive to be bonded to the cured silicone adhesive. However, in the present invention, the spacers 22 are included in the first adhesion layer 20 and the surfaces of the spacers 22 exposed by etching serve as bonding surfaces to the silicone adhesive which is included in the second adhesion layer 40. Therefore, the first adhesion layer 20 and the second adhesion layer 40 are easily bonded to each other and the adhesive force between the first adhesion layer 20 and the second adhesion layer 40 can be maintained.

Therefore, in the electrostatic chuck device 100, it is considered that the adhesive force between the first adhesion layer 20 and the second adhesion layer 40 adjacent to the first adhesion layer 20 is excellent.

The laminated configuration of the electrostatic chuck device according to the present invention is not limited to the configuration shown in FIG. 1.

Hereinafter, description will be made with reference numerals omitted.

[First Adhesion Layer]

The electrostatic chuck device according to the present invention is provided with the first adhesion layer for which bonds the electrostatic chuck section and the heating member together. The first adhesion layer contains the spacers and the silicone adhesive, the layer thickness D is in a range of 3 to 25 μm, and the ratio ($\phi_S/D$) between the layer thickness D and the average particle diameter $\phi_S$ of the spacers is in a range of 0.1 to 1.0.

The layer thickness D of the first adhesion layer is 3 μm or more, whereby the adhesive force between the electrostatic chuck section and the heating member can be increased. The layer thickness D of the first adhesion layer is 25 μm or less, whereby weakening of the first adhesion layer can be suppressed. The layer thickness D is preferably in a range of 3 to 10 μm.

(Spacer)

The spacer makes the layer thickness of the first adhesion layer a certain thickness and has a function of increasing the adhesive force as an adhesion point to the second adhesion layer.

The average particle diameter $\phi_S$ of the spacers has a relationship in which $\phi_S/D$ is in a range of 0.1 to 1.0 with respect to the layer thickness D of the first adhesion layer. The ratio $\phi_S/D$ is 0.1 or more, whereby the adhesive force between the electrostatic chuck section and the heating member can be obtained. From the viewpoint of further enhancing the adhesive force, it is preferable that the ratio $\phi_S/D$ is in a range of 0.25 to 1.0.

The average particle diameter $\phi_S$ of the spacers can be measured using a laser diffraction/scattering type particle size distribution measuring device.

The spacer is a spherical spacer having a shape factor in a range of 1.0 to 1.4, and it is preferable that the content rate of the spacers having a particle diameter more than twice an average particle diameter in which a cumulative volume percentage in the particle size distribution of the spacers is 50% is 0.1% by mass or less.

Here, the shape factor is calculated from the average value of the ratios between the long diameters of 10 spacers selected arbitrarily and the short diameters orthogonal to the long diameter by photographically observing the spacers with an electron microscope. If the spacer is only a spherical particle, the shape factor is 1.0, and it becomes aspherical as the shape factor deviates from 1.0.

Further, the content rate of the spacers having a particle diameter more than twice an average particle diameter in which a cumulative volume percentage in the particle size distribution of the spacers is 50% is 0.1% by mass or less, whereby the particle diameters of the spacers are easily aligned.

Therefore, spherical spacers with aligned particle diameters are present in the first adhesion layer, whereby it is possible to make the layer thickness of the first adhesion layer uniform, and as a result, the in-plane temperature uniformity of the electrostatic chuck section can be improved.

The shape factor is more preferably in a range of 1.0 to 1.3 and further preferably in a range of 1.0 to 1.2. Further, the content rate of the spacers having a particle diameter more than twice an average particle diameter in which a cumulative volume percentage in the particle size distribution of the spacers is 50% is more preferably 0.05% by mass or less and further preferably 0.01% by mass or less.

A material of the spacer is not particularly limited and may be an organic compound such as resin or may be an inorganic compound such as metal or a metal oxide. However, from the viewpoint of enhancing the adhesion property between the first adhesion layer and the second adhesion layer, it is preferable that the material is an inorganic compound and it is more preferable that the material is a metal oxide.

As the metal oxide, an oxide of an element such as zirconium (Zr), titanium (Ti), silicon (Si), aluminum (Al), iron (Fe), copper (Cu), zinc (Zn), yttrium (Y), niobium (Nb), molybdenum (Mo), indium (In), tin (Sn), tantalum (Ta), tungsten (W), lead (Pb), bismuth (Bi), cerium (Ce), antimony (Sb), or germanium (Ge) is used.

As the oxides of these elements, for example, a zirconium oxide ($ZrO_2$), a titanium oxide ($TiO_2$), a silicon oxide ($SiO_2$), an aluminum oxide ($Al_2O_3$), an iron oxide ($Fe_2O_3$, FeO, $Fe_3O_4$), a copper oxide (CuO, $Cu_2O$), a zinc oxide (ZnO), an yttrium oxide ($Y_2O_3$), a niobium oxide ($Nb_2O_5$), a molybdenum oxide ($MoO_3$), an indium oxide ($In_2O_3$, $In_2O$), a tin oxide ($SnO_2$), a tantalum oxide ($Ta_2O_5$), a tungsten oxide ($WO_3$, $W_2O_5$), a lead oxide (PbO, $PbO_2$), a bismuth oxide ($Bi_2O_3$), a cerium oxide ($CeO_2$, $Ce_2O_3$), an antimony oxide ($Sb_2O_3$, $Sb_2O_5$), a germanium oxide ($GeO_2$, GeO) and the like can be given.

Among them, a zirconium oxide ($ZrO_2$), a titanium oxide ($TiO_2$), a silicon oxide ($SiO_2$), and an aluminum oxide ($Al_2O_3$) are preferable, and a zirconium oxide ($ZrO_2$), a titanium oxide ($TiO_2$), and a silicon oxide ($SiO_2$) are more preferable, and a silicon oxide ($SiO_2$) is further preferable.

The density of the spacers in the first adhesion layer is preferably in a range of 0.00003 to 32% by mass. The spacer density is 0.00003% by mass or more, whereby it is possible to secure the layer thickness of the first adhesion layer and improve the adhesion property between the first adhesion layer and the second adhesion layer. The spacer density is 32% by mass or less, whereby it is possible to suppress a decrease in the adhesive force between the electrostatic chuck section and the heating member.

The spacer density is more preferably in a range of 0.2 to 32% by mass and further preferably in a range of 2 to 32% by mass.

(Silicone Adhesive)

The silicone adhesive has heat resistance up to 200° C., has a larger elongation than an adhesive containing epoxy resin or polyimide resin as its main component, which is the other heat resistant adhesive, can relax the stress between the electrostatic chuck section and the base section, and has high thermal conductivity.

The silicone adhesive is preferably silicone rubber having a condensation type or addition type reaction mechanism of one component and two components, and in general, a silicone adhesive which is represented by the following general formula (1) is used.

(1)

In the general formula (1), $R^1$ to $R^6$ each independently represent an alkyl group having 1 to 5 carbon atoms, an alkenyl group having 2 to 5 carbon atoms, or an aryl group having 6 to 12 carbon atoms, and some or all of hydrogen atoms of the alkyl group, the alkenyl group, and the aryl group may be substituted with fluorine atoms. m represents a repeating unit.

The alkyl group having 1 to 5 carbon atoms may be linear or branched, and a methyl group, an ethyl group, an n-propylisopropyl group, an n-butyl group, a t-butyl group, an n-pentyl group, or the like can be given as an example. The number of carbon atoms of each of $R^1$ to $R^6$ is independently preferably in a range of 1 to 3, more preferably in a range of 1 to 2, and further preferably 1.

As the alkenyl group having 2 to 5 carbon atoms, a vinyl group, a 1-propenyl group, an allyl group, a 1-butenyl group, a 2-butenyl group, a pentenyl group, or the like can be given as an example.

As the aryl group having 6 to 12 carbon atoms, a phenyl group, a naphthyl group, or the like is exemplified, and it may have a substituent such as an alkyl group having 1 to 5 carbon atoms, or a halogen atom.

Some or all of the hydrogen atoms of the alkyl group, the alkenyl group, and the aryl group in the general formula (1) may be substituted with fluorine atoms. If a propyl group is taken as an example, it may be a trifluoropropyl group ($—CH_2CH_2CF_3$) in which the hydrogen atom of the methyl group moiety at the terminal of the propyl group ($—CH_2CH_2CH_3$) is substituted with a fluorine atom.

The first adhesion layer may contain an adhesive except for the silicone adhesive, for example, an adhesive containing epoxy resin or polyimide resin as its main component. However, it is preferable that the content of the silicone adhesive is 70% by mass or more with respect to the total mass of the first adhesion layer. Further, the content of the silicone adhesive is preferably in a range of 70 to 100% by mass, more preferably in a range of 80 to 100% by mass, further preferably in a range of 90 to 100% by mass, with respect to all components excluding the spacer and the filler in the first adhesion layer.

As the silicone adhesive, a commercially available silicone adhesive (including a silicone adhesive compound) may be used, and a silicone adhesive compound (for example, SD 4580 PSA, SD 4584 PSA, SD 4585 PSA, SD 4587 L PSA, SD 4560 PSA, or the like) manufactured by Dow Corning Toray Co., Ltd., a silicone adhesive (for example, XE13-B3208, TSE3212, TSE3261-G, TSE3280-G, TSE3281-G, TSE3221, TSE3221S, TSE326, TSE326M, TSE325, or the like) manufactured by Momentive Performance Materials Inc., a silicone adhesive (for example, KE-1820, KE-1823, KE-1825, KE-1830, KE-1833, or the like) manufactured by Shin-Etsu Chemical Co., Ltd., or the like can be given as an example.

(Filler)

It is preferable that the first adhesion layer further contains fillers. The first adhesion layer contains the fillers, whereby the area of the adhesion point to the second adhesion layer in the first adhesion layer is increased, and thus the adhesive force between the first adhesion layer and the second adhesion layer is easily improved.

The filler preferably has a smaller diameter than the spacer, and specifically, it is preferable that a ratio ($\phi_F/D$) of the layer thickness D of the first adhesion layer and an average particle diameter $\phi_F$ of the fillers is 0.01 or more and less than 0.1. The filler has a smaller diameter ($\phi_F/D$ is less than 0.1) than the spacer, whereby the gap between the spacers is easily filled with the filler. The ratio $\phi_F/D$ is 0.01 or more, whereby it is possible to secure the area of the adhesion point to the second adhesion layer and improve the adhesive force.

The shape of the filler is preferably a shape having an aspect ratio in a range of 1 to 5 and more preferably a shape having an aspect ratio in a range 1 to 2.

Further, the ratio $\phi_F/D$ is more preferably in a range of 0.005 to 0.1 and further preferably in a range of 0.01 to 0.05.

The average particle diameter $\phi_F$ of the fillers can be measured using a laser diffraction/scattering type particle size distribution measuring device.

A material of the filler is not particularly limited and may be an organic compound such as resin or may be an inorganic compound such as metal or a metal oxide. However, from the viewpoint of enhancing the adhesion property between the first adhesion layer and the second adhesion layer, it is preferable that the material of the filler is an inorganic compound and it is more preferable that the material of the filler is a metal oxide.

As the metal oxide, various metal oxides listed in the description of the spacer can be given as an example, and among them, a zirconium oxide ($ZrO_2$), a titanium oxide ($TiO_2$), a silicon oxide ($SiO_2$), and an aluminum oxide ($Al_2O_3$) are preferable, a zirconium oxide ($ZrO_2$), a titanium oxide ($TiO_2$), and a silicon oxide ($SiO_2$) are more preferable, and a silicon oxide ($SiO_2$) is further preferable.

The density of the fillers in the first adhesion layer is not particularly limited. However, the density is preferably in a range of 10 to 50% by mass with respect to the total mass of the first adhesion layer. The amorphous filler density is 10% by mass or more, whereby it is possible to improve the adhesive force between the first adhesion layer and the second adhesion layer. The amorphous filler density is 50% by mass or less, whereby it is possible to suppress a decrease in the adhesive force between the electrostatic chuck section and the heating member.

The amorphous filler density is more preferably in a range of 10 to 40% by mass.

[Electrostatic Chuck Section]

The electrostatic chuck section 10 has one main surface serving as a placing surface 5 adapted to receive a plate-shaped sample, and has a built-in internal electrode for electrostatic attraction.

More specifically, for example, it is preferable that the electrostatic chuck section 10 is configured of a placing plate 4 having an upper surface serving as a placing surface 5 adapted to receive a plate-shaped sample such as a semiconductor wafer, a supporting plate 3 that is integrated with the placing plate 4 and supports the placing plate, an internal electrode for electrostatic attraction and an insulating material layer (an in-chuck insulating material layer) for insulating the surroundings of the internal electrode for electrostatic attraction, which are provided between the placing plate 4 and the supporting plate 3 and a power supply terminal which is provided so as to penetrate the supporting plate and applies a direct-current voltage to the internal electrode for electrostatic attraction.

In the electrostatic chuck section 10, the surface adjacent to the first adhesion layer 20 is the surface (the heating member installation surface) of a supporting plate 3 of the electrostatic chuck section 10.

The placing plate and the supporting plate have disk shapes in which the shapes of the superimposed surfaces are the same, and it is preferable that each of the placing plate and the supporting plate is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

A configuration is preferable in which a plurality of protrusion portions each having a diameter smaller than the thickness of the plate-shaped sample are formed on the placing surface of the placing plate and support the plate-shaped sample.

It is preferable that the thickness of the electrostatic chuck section (the total thickness of the placing plate and the supporting plate) is in a range of 0.7 mm to 5.0 mm. The thickness of the electrostatic chuck section is 0.7 mm or more, whereby it is possible to secure the mechanical strength of the electrostatic chuck section. The thickness of the electrostatic chuck section is 5.0 mm or less, whereby heat transfer in a lateral direction of the electrostatic chuck section does not easily increase and a predetermined in-plane temperature distribution is easily obtained. Therefore, heat capacity does not easily increase and a thermal responsiveness is not easily degraded. The lateral direction of the electrostatic chuck section refers to the direction orthogonal to a laminating direction in the laminated configuration of the electrostatic chuck section, the first and second adhesion layers, the sheet material, and the base section, as shown in FIG. 1.

The internal electrode for electrostatic attraction is used as an electrode for an electrostatic chuck for generating electric charges and fixing the plate-shaped sample with an electrostatic attraction force, and the shape or the size thereof is appropriately adjusted according to a use thereof.

The internal electrode for electrostatic attraction is formed of conductive ceramic such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, or an aluminum nitride-tantalum (AlN—Ta) conductive compound sintered compact, or high melting point metal such as tungsten (W), tantalum (Ta), or molybdenum (Mo).

The thickness of the internal electrode for electrostatic attraction is not particularly limited. However, the thickness of the internal electrode for electrostatic attraction is preferably in a range of 0.1 μm to 100 μm and more preferably in a range of 5 μm to 20 μm. The thickness of the internal electrode for electrostatic attraction is 0.1 μm or more, whereby it is possible to secure sufficient electric conductivity. The thickness is 100 μm or less, whereby it is difficult for the difference in coefficient of thermal expansion between the placing plate and the supporting plate, and the internal electrode for electrostatic attraction, to become large, and it is difficult for cracking to occur in the joint interface between the placing plate and the supporting plate.

The internal electrode for electrostatic attraction having such a thickness can be easily formed by a film formation method such as a sputtering method or a vapor deposition method, or a coating method such as a screen printing method.

The in-chuck insulating material layer surrounds the internal electrode for electrostatic attraction so as to protect the internal electrode for electrostatic attraction from corrosive gas and plasma thereof, and joins and integrates boundary portions of the placing plate and the supporting plate, that is, outer peripheral portion regions other than the internal electrode for electrostatic attraction. It is preferable that the in-chuck insulating material layer is configured of an insulating material having the same composition or the same main component as the materials configuring the placing plate and the supporting plate.

The power supply terminal is a rod-shaped member provided in order to apply a direct-current voltage to the internal electrode for electrostatic attraction. A material of the power supply terminal is not particularly limited as long as it is an electrically conductive material having excellent heat resistance. However, a material having a coefficient of thermal expansion close to the coefficients of thermal expansion of the internal electrode for electrostatic attraction and the supporting plate is preferable, and for example, conductive ceramic configuring the internal electrode for electrostatic attraction or a metal material such as tungsten (W), tantalum (Ta), molybdenum (Mo), niobium (Nb), or a kovar alloy is suitably used.

It is preferable that the power supply terminal is insulated from the base section by an insulator having insulation properties.

Further, it is preferable that the power supply terminal is joined to and integrated with the supporting plate and the placing plate and the supporting plate are joined to and integrated with each other by the internal electrode for electrostatic attraction and the in-chuck insulating material layer, thereby configuring the electrostatic chuck section.

[Heating Member]

The heating members are located on the surface on the side opposite to the placing surface of the electrostatic chuck section and fixed to the electrostatic chuck section in a pattern having a gap with respect to one another by an adhesive.

The form of the heating member is not particularly limited. However, it is preferable that the heating member is a heater element composed of two or more mutually independent heater patterns.

The heater element can be configured of, for example, two mutually independent heaters; an inner heater formed at a center portion of the surface (the heating member installation surface) on the side opposite to the placing surface of the electrostatic chuck section, and an outer heater annularly formed outside a peripheral edge portion of the inner heater. Each of the inner heater and the outer heater can have a single continuous strip-shaped heater pattern formed by repeatedly disposing a meandering pattern of a narrow strip-shaped metal material around the center axis of the heating member installation surface with the center axis as the center and connecting the patterns adjacent to each other.

By independently controlling each of the inner heater and the outer heater, it is possible to accurately control the in-plane temperature distribution of the plate-shaped sample fixed to the placing surface of the placing plate of the electrostatic chuck section by electrostatic attraction.

It is preferable that the heater element is formed by etching a nonmagnetic metal thin plate, for example, a titanium (Ti) thin plate, a tungsten (W) thin plate, a molybdenum (Mo) thin plate, or the like, having a constant thickness of preferably 0.2 mm or less and more preferably 0.1 mm or less, into a desired heater pattern by a photolithography method.

The thickness of the heater element is 0.2 mm or less, whereby it is difficult for the pattern shape of the heater element to be reflected as the temperature distribution of the plate-shaped sample and it becomes easy to maintain the in-plane temperature of the plate-shaped sample at a desired temperature pattern.

Further, if the heater element is formed of nonmagnetic metal, even if the electrostatic chuck device is used in a high frequency atmosphere, it is difficult for the heater element to cause self-heating due to a high frequency and it becomes easy to maintain the in-plane temperature of the plate-shaped sample at a desired constant temperature or a desired constant temperature pattern.

Further, if the heater element is formed using a nonmagnetic metal thin plate having a constant thickness, the thickness of the heater element becomes constant over the entire heating surface and the amount of heat generation also becomes constant over the entire heating surface. Therefore, it is possible to uniformize a temperature distribution in the placing surface of the electrostatic chuck section.

As an adhesive (an adhesive for the heating member) for fixing the heating member to the surface on the side opposite to the placing surface of the electrostatic chuck section, it is preferable to use a sheet-shaped or film-shaped adhesive resin having heat resistance and insulation properties, such as polyimide resin, silicone resin, or epoxy resin.

The thickness of the adhesive for the heating member is preferably in a range of 5 µm to 100 µm and more preferably in a range of 10 µm to 50 µm. From the viewpoint of enhancing the in-plane uniformity of heat which is transmitted the heating member to the electrostatic chuck section, it is preferable that variation in the in-plane thickness of the adhesive for the heating member is within 10 µm.

[Second Adhesion Layer]

The second adhesion layer is a layer for bonding the electrostatic chuck section with the heating members fixed thereto and the base section together and contains at least a silicone adhesive.

The silicone adhesive which can be included in the second adhesion layer is not particularly limited. However, it is preferable to use the silicone rubber which is represented by the general formula (1) described as the silicone adhesive which can be included in the first adhesion layer.

The silicone adhesive that can be included in the second adhesion layer may be of the same type as the silicone adhesive which is contained in the first adhesion layer, or may be a different type of silicone adhesive.

The second adhesion layer may include an adhesive except for the silicone adhesive, for example, an adhesive containing epoxy resin or polyimide resin as its main component. However, the content of the silicone adhesive is preferably 70% by mass or more with respect to the total mass of the second adhesion layer, more preferably in a range of 80 to 100% by mass, and further preferably in a range of 90 to 100% by mass.

The layer thickness of the second adhesion layer is not particularly limited. However, it is preferable that the layer thickness is in a range of 100 to 300 µm as the height from the surface of the heating member to the surface of the second adhesion layer. The layer thickness is 100 µm or more, whereby it is possible to enhance the adhesive force between the first adhesion layer and the heating member, and the base section, and perform stress relaxation of the thermal expansion difference between the temperature of the electrostatic chuck section and an aluminum base section having a cooling function. The layer thickness is 300 µm or less, whereby it is possible to suppress unevenness in the thickness of the adhesion layer.

It is more preferable that the layer thickness of the second adhesion layer (the height from the surface of the heating member to the surface of the second adhesion layer) is in a range of 150 to 250 µm.

[Base Section]

The base section is a member having a function of cooling the electrostatic chuck section and adjusting the temperature of the electrostatic chuck section heated by the heating member to a desired temperature, and also has a function of lowering heat generation caused by etching or the like of the plate-shaped sample fixed to the electrostatic chuck section.

The shape of the base section is not particularly limited. However, usually, it is a thick disk shape. It is preferable that the base section is a water-cooled base or the like, in which a flow path for circulating water is formed in the interior thereof.

As a material configuring the base section, metal which is excellent in thermal conductivity, electric conductivity, and workability, a compound material which includes the metal, or ceramic can be given as an example. Specifically, for example, aluminum (Al), an aluminum alloy, copper (Cu), a copper alloy, stainless steel (SUS), or the like is suitably used. It is preferable that at least the surface which is exposed to plasma, of the base section, is subjected to alumite treatment or has an insulating film such as alumina formed thereon.

[Insulating Material Layer]

It is preferable that the electrostatic chuck device has an insulating material layer which covers at least a part of the base section.

The electrostatic chuck device according to the present invention has the heating member which heats the electrostatic chuck section, and therefore, in order to suppress conduction (a short-circuit defect) between the electrostatic chuck section and the base section and improve the withstand voltage property of the base section, it is preferable to have an insulating material layer.

It is acceptable if the insulating material layer covers at least a part of the base section. However, it is preferable that the insulating material layer is a film-shaped or sheet-shaped layer which covers the entire base section.

Further, it is acceptable if the position of the insulating material layer is located between the electrostatic chuck section and the base section, and the insulating material layer may be configured in not only a single layer but also a plurality of layers. For example, the insulating material layer may be provided at a position adjacent to the base section, between the heating member and the electrostatic chuck section, between the heating member and the sheet material, or the like.

Among the above, from the viewpoint of easiness of the formation of the insulating material layer, it is preferable that the insulating material layer is provided at a position adjacent to the base section between the heating member and the base section.

In a case of fixing the insulating material layer to the base section, it is preferable that the insulating material layer is fixed to the upper surface of the base section through an adhesive. The adhesive (an adhesive for the insulating material layer) which is used for the fixing of the insulating material layer is not particularly limited, and a sheet-shaped or film-shaped adhesive resin having heat resistance and insulation properties, such as polyimide resin, silicone resin, or epoxy resin, can be used. The thickness of the adhesive for the insulating material layer is preferably in a range of 5 μm to 100 μm and more preferably in a range of 10 μm to 50 μm. From the viewpoint of enhancing the in-plane uniformity of the temperature control of the electrostatic chuck section by the base section, it is preferable that variation in the in-plane thickness of the adhesive for the insulating material layer is within 10 μm.

From the viewpoint of temperature adjustment of the electrostatic chuck section, the thermal conductivity of the insulating material layer is preferably in a range of 0.05 W/mK or more and 0.5 W/mK or less and more preferably in a range of 0.1 W/mK or more and 0.25 W/mK or less.

[Sheet Material]

The electrostatic chuck device may have a sheet material.

The sheet material is a member for relaxing stress which is caused by a difference in temperature between the electrostatic chuck section and the base section, and can be provided, for example, between the second adhesion layer and the insulating material layer or the base section.

From the viewpoint of stress relaxation, it is preferable that the sheet material contains any one which is selected from the group consisting of a silicone-based elastomer and a fluorine-based elastomer.

As the silicone-based elastomer, an elastomer containing organopolysiloxane as its main component, that is, a polydimethylsiloxane-based elastomer, a polymethylphenylsiloxane-based elastomer, a polydiphenylsiloxane-based elastomer, or the like is used. There is also an elastomer partially denatured with a vinyl group, an alkoxy group, or the like. As a specific example, KE series (manufactured by Shin-Etsu Chemical Co., Ltd.), SE series, CY series, and SH series (all manufactured by Dow Corning Toray Silicone Co., Ltd.), or the like can be given.

As the fluorine-based elastomer, an elastomer having a structure in which a hard segment is fluorine-based resin and a soft segment is fluorine-based rubber, an elastomer in which the hydrogen atoms of some or all of hydrocarbon groups which are included in a silicone-based elastomer are substituted with fluorine atoms, or the like can be given as an example.

The sheet material may include the silicone-based elastomer or the fluorine-based elastomer independently, may include two or more types, or may include all of one or more types of silicone-based elastomers and one or more types of fluorine-based elastomers.

It is preferable that the sheet material is thicker than the total layer thickness of the first adhesion layer and the second adhesion layer. Further, it is preferable that the thickness of the sheet material is in a range of 20 μm to 500 μm. The thickness of the sheet material is 20 μm or more, whereby it is easy to relax stress which is caused by a difference in temperature between the electrostatic chuck section and the base section. The thickness of the sheet material is 500 μm or less, whereby it is possible to suppress a decrease in the in-plane temperature uniformity of the electrostatic chuck section.

From the viewpoint of relaxing stress which is caused by a difference in temperature between the electrostatic chuck section and the base section, it is preferable that the Shore hardness (A) of the sheet material is in a range of 20 to 80.

<Method of Manufacturing Electrostatic Chuck Device>

A method of manufacturing the electrostatic chuck device is not particularly limited as long as it is a method capable of forming the laminated configuration of the electrostatic chuck device according to the present invention. For example, a method of bonding the electrostatic chuck section with the heating member fixed thereto with the first adhesion layer to the base section with the second adhesion layer, a method of bonding the base section and the heating member together with the second adhesion layer and then bonding the heating member, the surface of the second adhesion layer, and the electrostatic chuck section together with the first adhesion layer, or the like can be given. However, from the viewpoint of improving the adhesive force between the first adhesion layer and the second adhesion layer, the following method is preferable.

That is, it is preferable that the electrostatic chuck device is manufactured by a manufacturing method having a heating member bonding process of bonding the heating member onto the first adhesion layer by applying a first adhesion component which includes at least a silicone adhesive and spacers to the heating member installation surface of the electrostatic chuck section and further stacking a film-shaped or plate-shaped heating member thereon, an etching process of cutting off a part of the heating member by etching to expose apart of each of the spacers in the first adhesion layer, a base section bonding process (a base section bonding process a) of bonding the base section onto the second adhesion layer by applying a second adhesion component which includes at least a silicone adhesive onto the heating member and the first adhesion layer and further stacking the base section thereon, and a hot calender process of pressing a laminated body, in which at least the electrostatic chuck section, the first adhesion layer, the heating member, the second adhesion layer, and the base section are stacked, by a hot calender.

The base section bonding process a may be replaced by a base section bonding process b having a functional layer bonding process of bonding a functional layer onto the second adhesion layer by applying the second adhesion component which includes at least a silicone adhesive onto the heating member and the first adhesion layer and further stacking the functional layer such as the insulating material layer or the sheet material thereon, and a bonding process of bonding the base section onto the functional layer by applying a third adhesion component onto the functional layer and further stacking the base section thereon.

From the viewpoint of more easily performing the bonding of the electrostatic chuck section and the base section, in a case where the electrostatic chuck device is provided with the functional layer such as the insulating material layer or the sheet material, it is preferable to bond the functional layer to the surface of the base section in advance with an adhesive (the third adhesion component) and bond the surface of the functional layer onto the second adhesion layer in the base section bonding step a.

Hereinafter, the above manufacturing method will be described in more detail.

Hereinafter, the base section will be described with a configuration, in which the functional layer such as the insulating material layer is not fixed thereto, as a representative. In the following description, in a configuration in which the functional layer is fixed onto the base section, the "surface of the base section" may be read to be replaced by the "surface of the functional layer".

[Heating Member Bonding Process]

In the heating member bonding process, the heating member is bonded onto the first adhesion layer by applying the first adhesion component which includes at least a silicone adhesive onto the heating member installation surface (the surface on the side opposite to the placing surface) of the electrostatic chuck section and further stacking the film-shaped or plate-shaped heating member thereon.

The silicone adhesive and the spacer which are included in the first adhesion component are the same as the silicone adhesive and the spacer which are included in the first adhesion layer, and the preferred aspect thereof are also the same. The first adhesion component may include an adhesive except for the silicone adhesive as long as the effect of the present invention is not impaired.

The silicone adhesive may be any one of a liquid adhesive having low viscosity, a liquid adhesive having high viscosity, and a solid adhesive. However, from the viewpoint of preventing a solvent from remaining in the electrostatic chuck device, it is preferable to use a liquid silicone adhesive which does not include a solvent.

In a case of using a solid silicone adhesive or a liquid silicone adhesive having high viscosity, from the viewpoint of easiness of application, a solution for an adhesion layer in which a silicone adhesive is dissolved in a solvent may be used.

As the solvent, at least one type which is selected from the group consisting of alcohol and a ketone can be given as an example. As alcohol, methanol, ethanol, isopropyl alcohol, or the like can be given as an example, and as ketone, acetone, a methyl ethyl ketone, or the like can be given as an example.

As described above, if the material of the spacer is a metal oxide, it is possible to enhance the adhesion property between the first adhesion layer and the second adhesion layer, and thus it is preferable. Further, if particles having high polarity like a metal oxide are blended to a nonpolar component such as a silicone adhesive, the metal oxide particles are attracted by air having high polarity and easily gathered on the surface of the silicone adhesive (the surface of the adhesion layer). Therefore, if the heating member is removed by etching or the like after the first adhesion component is applied to the heating member installation surface and the heating member is bonded onto the first adhesion layer, the spacer surface is easily exposed. Accordingly, if the material of the spacer is a metal oxide, even in a case where the average particle diameter of the spacers is smaller than the layer thickness ID of the first adhesion layer (for example, $\phi_S/D$ is 0.3), the spacer is easily exposed by removing the heating member.

In this manner, from the viewpoint of facilitating adsorption of the spacer to the surface of the adhesion layer, it is preferable that the material of the spacer is a metal oxide, and it is preferable that the silicone adhesive is a liquid silicone adhesive or a solution for an adhesion layer dissolved in a solvent such that the spacer easily moves.

Further, from the viewpoint of increasing the number of adhesion points to the second adhesion layer and from the viewpoint of facilitating adsorption to the surface of the first adhesion layer, it is preferable that the filler which is optionally included in the first adhesion layer is also a metal oxide.

From the viewpoint of setting the layer thickness D of the first adhesion layer to be in a range of 3 to 25 μm and setting the ratio ($\phi_S/D$) between the layer thickness D and the average particle diameter $\phi_S$ of the spacers to be in a range of 0.1 to 1.0, it is preferable that the densities of the silicone adhesive and the spacers in the first adhesion component are set to be in the following range.

The density of the silicone adhesive in the first adhesion component depends on the type of the silicone adhesive which is used, a method of coating the first adhesion component, or the like. However, for example, in the case of coating by spin coating, the density of the silicone adhesive is preferably in a range of 0.05 to 5% by mass and more preferably in a range of 0.1 to 1% by mass. In a case where the coating method is screen printing, the density of the silicone adhesive in the first adhesion component is preferably in a range of 30 to 70% by mass and more preferably in a range of 40 to 60% by mass.

Further, the density of the spacers in the first adhesion component is preferably in a range of 0.1 to 30% by mass and more preferably in a range of 1 to 25% by mass.

Further, in a case where the first adhesion component also includes the filler, from the viewpoint of setting the ratio ($\phi_F/D$) between the layer thickness D of the first adhesion layer and the average particle diameter $\phi_F$ of the fillers to be 0.01 or more and less than 0.2, the density of the spacers in the first adhesion component is preferably in a range of 0.1 to 20% by mass and more preferably in a range of 0.1 to 15% by mass.

As a method of applying the first adhesion component to the heating member installation surface of the electrostatic chuck section, in addition to application by screen printing and coating by spin coating as described above, application with spray, a brush, or a bar coater, discharge by an inkjet method, or the like can be given as an example. Among them, from the viewpoint of easiness of adjustment of the layer thickness of the first adhesion layer, the application by screen printing is preferable.

After the first adhesion component which includes a solvent is applied to the electrostatic chuck section, it is preferable to remove the solvent by heating the first adhesion component-applied surface. By heating the first adhesion component-applied surface, it is possible to enhance the adhesion property between the electrostatic chuck section and the heating member.

The heating of the first adhesion component-applied surface varies depending on the thickness of the first adhesion layer, the densities and the types of the silicone adhesive and the spacer in the first adhesion component, or the like. However, it is preferable that the heating is performed at a temperature in a range of 80° C. to 120° C. under the condition in a range of 30 seconds to 5 minutes.

[Etching Process]

In the etching process, a part of the heating member is cut off by etching to expose a part of each of the spacers in the first adhesion layer.

A part of the heating member is removed by etching, whereby the surface of the first adhesion layer is also shaved off, so that a part of each of the spacers in the first adhesion layer is easily exposed. In a case where the first adhesion layer further contains the fillers, a part of each of the fillers is also easily exposed, so that an adhesion point to the silicone adhesive configuring the second adhesion layer is easily obtained.

[Base Section Bonding Process]

(Base Section Bonding Process a)

In the base section bonding process a, the base section is bonded onto the second adhesion layer by applying the second adhesive component which includes at least a silicone adhesive onto the heating member and the first adhesion layer and further stacking the base section thereon, The silicone adhesive which is included in the second adhesion component is the same as the silicone adhesive which is included in the second adhesion layer, and the preferred aspect thereof is also the same. The second adhesion component may include an adhesive except for the silicone adhesive as long as the effect of the present invention is not impaired.

As the silicone adhesive which is included in the second adhesion component, a silicone adhesive having the same type and the same properties as the silicone adhesive which is included in the first adhesion component can be used, and the preferred aspect thereof is also the same. The same applies to an example of a solvent of making the second adhesion component a solution for an adhesive layer in which a silicone adhesive is dissolved in a solvent.

The density of the silicone adhesive in the second adhesion component depends on the type of the silicone adhesive which is used, a method of coating the second adhesion component, or the like. However, for example, in the case of coating by spin coating, the density of the silicone adhesive in the second adhesion component is preferably in a range of 0.05% by mass to 5% by mass and more preferably in a range of 0.1% by mass to 1% by mass. In a case where the coating method is screen printing, the density of the silicone adhesive is preferably in a range of 30% by mass to 70% by mass and more preferably in a range of 40% by mass to 60% by mass.

The base section is stacked on the second adhesion component-applied surface, whereby a laminated body in which at least the electrostatic chuck section, the first adhesion layer, the heating member, the second adhesion layer, and the base section are stacked is obtained.

In a case where the electrostatic chuck device is provided with a functional layer such as an insulating material layer or a sheet material, it is preferable that the functional layer such as an insulating material layer or a sheet material is bonded to the base section in advance with a third adhesion component. The third adhesion component preferably includes the adhesive described as the adhesive for the insulating material layer. As the adhesive for the insulating material layer, it is preferable to use a liquid adhesive, and in a case where the adhesive is a solid adhesive, it may be used in the form of a solution dissolved with the solvent described above. As a method of applying the third adhesion component to the base section, the same method as the method of applying the first adhesion component to the electrostatic chuck section can be used.

The surface of the functional layer bonded to the base section in advance is stacked on the second adhesion component-applied surface, whereby a laminated body in which the electrostatic chuck section, the first adhesion layer, the heating member, the second adhesion layer, the functional layer, and the base section are stacked is obtained.

(Base Section Bonding Process b)

The base section bonding process b has a functional layer bonding process of bonding the functional layer onto the second adhesion layer by applying the second adhesion component which includes at least a silicone adhesive onto the heating member and the first adhesion layer and further stacking the functional layer such as an insulating material layer or a sheet material thereon, and a bonding process of bonding the base section onto the functional layer by applying the third adhesion component onto the functional layer and further stacking the base section thereon.

A method of applying the second adhesion component which includes at least a silicone adhesive onto the heating member and the first adhesion layer may be performed in the same manner as in the base section bonding process a.

By stacking the functional layer on the second adhesion component-applied surface which is obtained by the base section bonding step a, subsequently, applying the third adhesion component to the functional layer, and stacking the base section on the third adhesion component-applied surface, a laminated body in which the electrostatic chuck section, the first adhesion layer, the heating member, the second adhesion layer, the functional layer, and the base section are stacked is obtained.

[Hot Calender Process]

In the hot calender process, the laminated body in which at least the electrostatic chuck section, the first adhesion layer, the heating member, the second adhesion layer, and the base section are stacked is pressed by a hot calender.

The layer thickness D of the first adhesion layer is reduced by pressing the laminated body with the hot calender. However, due to the presence of the spacers in the first adhesion layer, the ratio ($\phi_S/D$) between the layer thickness D and the average particle diameter $\phi_S$ of the spacers is maintained in a range of 0.1 to 1.0.

From the viewpoint of setting the layer thickness D of the first adhesion layer to be in a range of 3 to 25 μm and setting the ratio ($\phi_S/D$) between the layer thickness D and the average particle diameter $\phi_S$ of the spacers to be in a range of 0.1 to 1.0 while suppressing deformation of and damage to the laminated body, the pressing load of the laminated body is preferably in a range of 0.1 to 5 MPa.

Further, it is preferable that the electrostatic chuck section is manufactured as follows.

First, the plate-shaped placing plate and the plate-shaped supporting plate are fabricated by using an aluminum oxide-silicon carbide ($Al_2O_3$—SiC) compound sintered compact. In this case, each of the placing plate and the supporting plate can be obtained by forming mixed powder which includes silicon carbide powder and aluminum oxide powder into a desired shape and thereafter, performing calcination for a predetermined time at a temperature in a range of 1600° C. to 2000° C., for example, and under a non-oxidative atmosphere, preferably, an inert atmosphere.

Subsequently, a plurality of fixing holes for fitting and holding the power supply terminals therein are formed in the supporting plate. The power supply terminal is fabricated so as to have a size and a shape in which the power supply terminal can be fixed in close contact with the fixing hole of the supporting plate. As a method of fabricating the power supply terminal, for example, in a case where the power supply terminal is made of a conductive compound sintered compact, a method in which conductive ceramic powder is formed into a desired shape and pressed and calcinated, or the like can be given as an example.

At this time, as the conductive ceramic powder which is used for the power supply terminal, conductive ceramic powder made of the same material as the internal electrode for electrostatic attraction is preferable.

Further, in a case where the power supply terminal is made of metal, high melting point metal is used, and a method of forming it by a metal working method such as a grinding method or a powder metallurgy, or the like can be given as an example.

Subsequently, a layer for formation of the internal electrode for electrostatic attraction is formed by applying a coating liquid for formation of the internal electrode for electrostatic attraction, in which a conductive material such as the above-described conductive ceramic powder is dispersed in an organic solvent which includes terpineol, ethyl cellulose, and the like, to a predetermined area of the surface of the supporting plate with the power supply terminals fitted therein, so as to comes into contact with the power supply terminals, and drying it.

As the application method, it is desirable to use a screen printing method or the like, because it is necessary to apply the coating liquid in a uniform thickness. Further, as other methods, there are a method of forming a thin film of the above-described high melting point metal by a vapor deposition method or a sputtering method, a method of forming the layer for formation of the internal electrode for electrostatic attraction by disposing a thin plate made of the above-described conductive ceramic or high melting point metal, and the like.

Further, the in-chuck insulating material layer which includes a powder material having the same composition or the same main component as the placing plate and the supporting plate is formed at an area except for the area in which the layer for formation of the internal electrode for electrostatic attraction is formed, on the supporting plate, in order to improve insulation properties, corrosion resistance, and plasma resistance. The in-chuck insulating material layer can be formed, for example, by applying a coating liquid in which insulating material powder having the same composition or the same main component as the placing plate and the supporting plate is dispersed in an organic solvent which includes terpineol, ethyl cellulose, and the like, to the predetermined area by screen printing or the like, and drying it.

Subsequently, the placing plate is superimposed on the layer for formation of the internal electrode for electrostatic attraction and the insulating material on the supporting plate, and subsequently, these are integrated together by hot calender work under a high temperature and high pressure. It is preferable that an atmosphere in this hot calender work is vacuum or an inert atmosphere such as Ar, He, $N_2$, or the like. Further, the pressure is preferably in a range of 5 to 10 MPa, and the temperature is preferably in a range of 1600° C. to 1850° C.

The layer for formation of the internal electrode for electrostatic attraction is calcinated by the hot calender, whereby the internal electrode for electrostatic attraction made of a conductive compound sintered compact is obtained. At the same time, the supporting plate and the placing plate are joined to and integrated with each other with the in-chuck insulating material layer interposed therebetween.

Further, the power supply terminals are re-calcinated by the hot calender under a high temperature and high pressure and fixed in close contact with the fixing holes of the supporting plate.

Then, the electrostatic chuck section is obtained by machining the upper and lower surfaces, the outer periphery, a gas hole, and the like of the joined body.

EXAMPLES

Hereinafter, the present invention will be described using examples. However, the present invention is not limited to these examples.

In the following examples and comparative examples, laminated bodies similar to the laminated configuration of the electrostatic chuck device shown in FIG. 1 were fabricated and evaluated.

1. Configurations of Laminated Bodies of Examples and Comparative Examples

Each of the laminated bodies of examples and comparative examples has a configuration in which the electrostatic chuck section 10, the first adhesion layer 20, the heating member 30, the second adhesion layer 40, and the base section 60 in FIG. 1 are stacked in this order. The laminated bodies of the examples and the comparative examples do not have the insulating material layer 50 in FIG. 1, and the laminated bodies of some comparative examples do not have the spacers in the first adhesion layer 20.

In the examples and the comparative examples, the electrostatic chuck section 10 in FIG. 1 is referred to as a base material 1 and the base section 60 is referred to as a base material 2.

2. Raw Material

Base material 1: ceramic plate ($Al_2O_3$—SiC compound sintered compact)
Base material 2: aluminum jig (diameter: 40 mm), thickness: 2 cm
Heating member: Ti foil
First Adhesion Component The first adhesion component was obtained by diluting the following silicone adhesive with methyl ethyl ketone to a density of 30% by mass and mixing the spacers having the shape, the average particle diameter (μm), and the type shown in Table 1 at the density shown in Table 1.

With respect to Examples 9, 10 and 12, the first adhesion component was obtained by further mixing the fillers having the average particle diameter (μm) and the type shown in Table 1 at the density shown in Table 1.

Silicone Adhesive: silicone adhesive TSE3221 (one component thermally-curable adhesive liquid silicone rubber) manufactured by Momentive Performance Materials Japan Limited Details of the spacer and the filler used in the first adhesion component are as follows.

(1) Spacer

Excelica UF-305 (average particle diameter $\phi_S$=2.7 μm) manufactured by Tokuyama Corp.

Advanced alumina AA-3 (average particle diameter $\phi_S$=3 μm) manufactured by Sumitomo Chemical Co., Ltd.

Advanced alumina AA-10 (average particle diameter $\phi_S$=10 μm) manufactured by Sumitomo Chemical Co., Ltd.

(2) Filler

Advanced alumina AA-03 (average particle diameter $\phi_F$=0.3 μm) manufactured by Sumitomo Chemical Co., Ltd.

The content rate of particles having a particle diameter of 5 μm or more which are Excelica UF-305 manufactured by Tokuyama Corp. is as follows.

(Particle Size Distribution)
45 μm or more: 0.00% by mass
25 μm or more and less than 45 μm: 0.00% by mass
20 μm or more and less than 25 μm: 0.00% by mass
10 μm or more and less than 20 μm: 0.00% by mass
5 μm or more and less than 10 μm: 0.03% by mass Second Adhesion Component Silicone adhesive TSE3221 (one component thermally-curable adhesive liquid silicone rubber) manufactured by Momentive Performance Materials Japan Limited was diluted with methyl ethyl ketone to a density of 30% by mass and used.

3. Manufacturing of Laminated Body

Examples 1 to 12 and Comparative Examples 2 and 3

The first adhesion component was screen-printed on the base material 1, thereby forming the first adhesion layer, and Ti foil (the heating member) was stuck thereto. Subsequently, a Ti pattern in which annular Ti foils having different diameters were concentrically disposed was formed by exposing a part of the first adhesion layer by etching the Ti foil.

The second adhesion layer was formed by applying the second adhesion component onto a ceramic plate having a concavo-convex surface due to the Ti pattern formed thereon, by screen printing. Subsequently, a laminated body was obtained by stacking the base material 2 on the second adhesion layer. Further, the obtained laminated body was pressed by a hot calender, whereby a laminated body having the first adhesion layer having the layer thickness D shown in Table 1 was obtained.

Further, $\phi_S/D$ and $\phi_F/D$ of each laminated body after being pressed by the hot calender are also shown in Table 1.

Comparative Example 1

A laminated body was manufactured in the same manner as in Example 1 except that the first adhesion component was not applied onto the base material 1.

4. Evaluation Method

1. Peeling Strength

With respect to each of the laminated bodies of the examples and the comparative examples, heating and pressurization were performed at 120° C. for 12 hours while applying a load of 10 kg, whereby a test piece for peeling strength evaluation was made.

The base material 2 was peeled off from the base material 1 of the test piece by the hand, and the destruction state of the peeled surface was visually observed and evaluated according to the following criteria.

A+: Very strong adhesive strength (cohesive failure)
A: Very strong adhesive strength (cohesive failure, mixture of cohesive failure and interfacial failure)
B: Strong adhesive strength (interfacial failure: the degree of a gum tape)
C: Bonded with very weak adhesion (interfacial failure: the degree of a cellophane tape)
D: Not bonded 2. Film Thickness Fluctuation The total layer thicknesses at five places in each of the laminated bodies of the examples and the comparative examples were measured using Film thickness meter VL-50A manufactured by Mitutoyo Corporation. Among the obtained measurement results, the difference between the layer thickness of the place having the largest layer thickness and the layer thickness of the place having the smallest layer thickness was set to be a film thickness fluctuation, and evaluation was performed according to the following criteria.

The film thickness fluctuation serves as an index of the in-plane temperature uniformity of a wafer which is fixed to the electrostatic chuck device, and the smaller the film thickness fluctuation, the more excellent the in-plane temperature uniformity of the electrostatic chuck section is. Specifically, the evaluation was performed according to the following criteria.

A+: The film thickness fluctuation was less than 1 μm.
A: The film thickness fluctuation was 1 μm or more and less than 2 μm.
A−: The film thickness fluctuation was 2 μm or more and less than 3 μm.
B: The film thickness fluctuation was 3 μm or more and less than 10 μm.
C: The film thickness fluctuation was 10 μm or more.

TABLE 1

| | First adhesion layer | | | | | | | | | | |
|---|---|---|---|---|---|---|---|---|---|---|---|
| | Spacer | | | | Filler | | | | | Evaluation | |
| | Type | Density % by mass | Shape | Average particle diameter $\phi_S$ μm | Type | Density % by mass | Average particle diameter $\phi_F$ μm | Layer thickness D μm | $\phi_S/D$ | $\phi_F/D$ | Peeling strength | Film thickness fluctuation |
| Example 1 | SiO$_2$ | 1 | Spherical | 2.7 | — | — | — | 10 | 0.27 | — | A | A− |
| Example 2 | SiO$_2$ | 2 | Spherical | 2.7 | — | — | — | 10 | 0.27 | — | A | A |
| Example 3 | SiO$_2$ | 25 | Spherical | 2.7 | — | — | — | 10 | 0.27 | — | A | A |
| Example 4 | SiO$_2$ | 25 | Spherical | 2.7 | — | — | — | 3 | 0.9 | — | A | A+ |
| Example 5 | SiO$_2$ | 25 | Spherical | 2.7 | — | — | — | 15 | 0.18 | — | A | A− |
| Example 6 | SiO$_2$ | 25 | Spherical | 2.7 | — | — | — | 25 | 0.11 | — | A | A− |
| Example 7 | Al$_2$O$_3$ | 25 | Spherical | 3 | — | — | — | 10 | 0.3 | — | A | A |
| Example 8 | Al$_2$O$_3$ | 25 | Polyhedral | 10 | — | — | — | 10 | 1 | — | A | A− |
| Example 9 | SiO$_2$ | 25 | Spherical | 2.7 | Al$_2$O$_3$ | 10 | 0.3 | 10 | 0.27 | 0.03 | A+ | A |
| Example 10 | SiO$_2$ | 25 | Spherical | 2.7 | Al$_2$O$_3$ | 50 | 0.3 | 10 | 0.27 | 0.03 | A+ | A |

TABLE 1-continued

| | First adhesion layer | | | | | | | | | Evaluation | |
|---|---|---|---|---|---|---|---|---|---|---|---|
| | Spacer | | | | Filler | | | | | | |
| | Type | Density % by mass | Shape | Average particle diameter $\phi_S$ μm | Type | Density % by mass | Average particle diameter $\phi_F$ μm | Layer thickness D μm | $\phi_S/D$ | $\phi_F/D$ | Peeling strength | Film thickness fluctuation |
| Example 11 | SiO$_2$ | 40 | Spherical | 2.7 | — | — | — | 10 | 0.27 | — | B | A |
| Example 12 | SiO$_2$ | 25 | Spherical | 2.7 | Al$_2$O$_3$ | 60 | 0.3 | 10 | 0.27 | 0.03 | B | A |
| Comparative Example 1 | — | — | — | — | — | — | — | 10 | 0.27 | — | C | A- |
| Comparative Example 2 | SiO$_2$ | 25 | Spherical | 2.7 | — | — | — | 1 | 2.7 | — | C | A |
| Comparative Example 3 | SiO$_2$ | 25 | Spherical | 2.7 | — | — | — | 50 | 0.05 | — | A | B |

As can be seen from Table 1, in the laminated bodies of the examples, the adhesive force between the first adhesion layer and the second adhesion layer adjacent to the first adhesion layer was high, and the in-plane temperature uniformity of the electrostatic chuck section was excellent. Therefore, if the electrostatic chuck device having each of the laminated configurations of the examples is fabricated, it is expected that the adhesion property between the electrostatic chuck section and the base section is excellent and the in-plane temperature uniformity of the electrostatic chuck section is excellent.

REFERENCE SIGNS LIST

100: electrostatic chuck device
10: electrostatic chuck section
20: first adhesion layer
22: spacer
24: silicone adhesive
30: heating member
40: second adhesion layer
50: insulating material layer
60: base section
D: layer thickness of first adhesion layer
$\phi_S$: average particle diameter of spacers

The invention claimed is:

1. An electrostatic chuck device comprising:
   an electrostatic chuck section having one main surface serving as a placing surface adapted to receive a plate-shaped sample, and having a built-in internal electrode for electrostatic attraction;
   a first adhesion layer which contains spacers and a silicone adhesive and in which a layer thickness D is in a range of 3 to 25 μm and a ratio ($\phi_S/D$) between the layer thickness D and an average particle diameter $\phi_S$ of the spacers is in a range of 0.1 to 1.0;
   a plurality of heating members bonded to the surface on the side opposite to the placing surface of the electrostatic chuck section in a pattern having a gap with respect to one another by the first adhesion layer;
   a second adhesion layer which contains a silicone adhesive; and
   a base section having a function of cooling the electrostatic chuck section;
   wherein a density of the spacer in the first adhesion layer is in a range of 0.00003 to 32% by mass.

2. The electrostatic chuck device according to claim 1, wherein a content rate of the spacers having a particle diameter more than twice the average particle diameter in which a cumulative volume percentage in a particle size distribution of the spacers is 50% is 0.1% by mass or less.

3. The electrostatic chuck device according to claim 1, wherein the first adhesion layer further includes fillers, and a ratio ($\phi_F/D$) between the layer thickness D of the first adhesion layer and an average particle diameter $\phi_F$ of the fillers is 0.01 or more and less than 0.1.

4. The electrostatic chuck device according to claim 1, wherein the spacer is a metal oxide.

5. The electrostatic chuck device according to claim 3, wherein the filler is a metal oxide.

6. The electrostatic chuck device according to claim 1,
   wherein the electrostatic chuck section is configured to include a placing plate having one main surface serving as the placing surface on which the plate-shaped sample is placed, and a supporting plate which is integrated with the placing plate and supports the placing plate, and
   each of the placing plate and the supporting plate is made of an aluminum oxide-silicon carbide (Al$_2$O$_3$—SiC) compound sintered compact, an aluminum oxide (Al$_2$O$_3$) sintered compact, an aluminum nitride (AlN) sintered compact, or an yttrium oxide (Y$_2$O$_3$) sintered compact.

* * * * *